(12) United States Patent
Nicholson et al.

(10) Patent No.: US 6,486,818 B1
(45) Date of Patent: Nov. 26, 2002

(54) SEGMENTED RESISTOR STRING DIGITAL-TO-ANALOG CONVERTERS

(75) Inventors: Richard Nicholson, Andover (GB); Simon Churchill, Whitchurch (GB)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/916,067

(22) Filed: Jul. 26, 2001

(51) Int. Cl.[7] .............................. H03M 1/66; H03M 1/78
(52) U.S. Cl. ................................. 341/154; 341/145
(58) Field of Search ............................... 341/143, 144, 341/145, 153, 154, 118, 120

(56) References Cited

U.S. PATENT DOCUMENTS

| | | | |
|---|---|---|---|
| 4,488,144 A | * 12/1984 | Wollman | 341/118 |
| 5,017,918 A | * 5/1991 | Matsusako | 341/118 |
| 5,294,927 A | * 3/1994 | Levinson et al. | 341/141 |
| 5,396,245 A | 3/1995 | Rempfer | |
| 5,568,146 A | 10/1996 | Park | |
| 5,703,588 A | 12/1997 | Rivoir et al. | |
| 5,969,657 A | 10/1999 | Dempsey et al. | |
| 6,072,415 A | * 6/2000 | Cheng | 341/144 |
| 6,246,351 B1 | * 6/2001 | Yilmaz | 341/145 |

* cited by examiner

*Primary Examiner*—Patrick Wamsley
(74) *Attorney, Agent, or Firm*—Blakely, Sokoloff, Taylor & Zafman LLP

(57) ABSTRACT

Segmented resistor string digital-to-analog converters using a resistor string primary converter segment and a current source secondary. The primary converter segment provides conversion of the most significant bits to an analog voltage form and the current source provides conversion of the least significant bits to an analog current form. An output circuit combines the two into a single analog output. Various embodiments are disclosed.

12 Claims, 3 Drawing Sheets

SEGMENTED RESISTOR STRING DIGITAL-TO-ANALOG CONVERTERS

BACKGROUND OF THE INVENTION

1. Field of the Invention

The present invention relates to the field of integrated circuit digital-to-analog converters.

2. Prior Art

A simple digital-to-analog converter is comprised of a plurality of resistors coupled in series across a voltage reference, with a decoder receiving and decoding a digital input signal to control switches to couple the voltage of the selected node between resistors to the digital-to-analog converter output. A segmented resistor string digital-to-analog converter is similar in some respects, though contains first and second pluralities of resistors, each plurality of resistors being coupled in series to define two resistor strings. The first resistor string is coupled across a voltage reference. The second resistor string is coupled across two adjacent nodes in the first resistor string selected in response to the output of a decoder driven by the most significant bits of the digital input signal. The least significant bits of the input signal are decoded and used to couple the selected node between resistors in the second resistor string to the digital-to-analog converter output.

Many segmented resistor string architectures for digital-to-analog converters are well known in the prior art. These architectures include isolating the primary string from a secondary string by use of a pair of unity gain buffers, and applying a secondary resistor string directly across a primary string element and predicting the voltage shifts in the primary string voltages. Other similar, and more exotic, approaches are also known in the prior art.

BRIEF SUMMARY OF THE INVENTION

Segmented resistor string digital-to-analog converters using a resistor string primary converter segment and a current source secondary. The primary converter segment provides conversion of the most significant bits to an analog voltage form and the current source provides conversion of the least significant bits to an analog current form. An output circuit combines the two into a single analog output. Various embodiments are disclosed, including an embodiment using a binary weighted current source and an embodiment using a thermometer code current source.

DETAILED DESCRIPTION OF THE PREFERRED EMBODIMENT

The present invention is a simple segmented architecture for segmented resistor string digital-to-analog converters ideally suited for medium speed, high accuracy (10 to 14 bit, depending on the fabrication process used) digital-to-analog converters in a very compact footprint, which converters do not require trimming, and have the predictable, linear, monotonic, low glitch operation inherent in resistor-string digital-to-analog converters.

Figure 1:
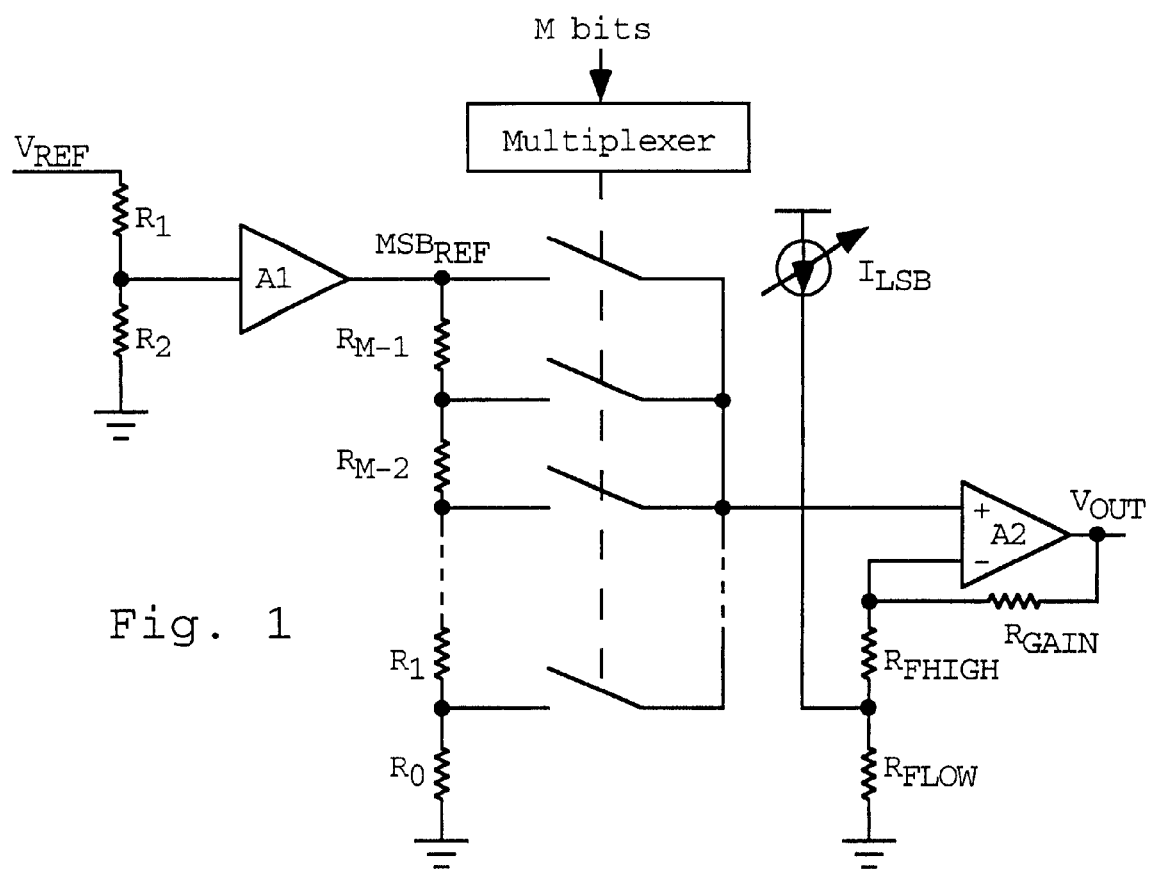
FIG. 1 illustrates an exemplary embodiment of the present invention.

Now referring to FIG. 1, an exemplary embodiment of the present invention may be seen. In this FIG., $V_{REF}$ is the reference voltage for the digital-to-analog converter. The low reference in this case is shown as ground, but this is not mandatory. Also, while the reference voltage for a digital-to-analog converter is normally a fixed reference voltage, this is not a requirement, as variable reference voltages are sometimes used as is well known in the art, such as in ratiometric devices, where the output is to be some commanded fraction of the input (reference) voltage.

In the embodiment shown, resistors $R_1$ and $R_2$ and amplifier A1 form a voltage divider with gain G1 given by:

$$G1 = \frac{V(MSB_{REF})}{V_{REF}} = \frac{R_2}{R_1 + R_2} * A1$$

where A1 is the gain of amplifier A1.

The gain G1 is typically around 0.5, although any value may be used. Also the voltage divider comprising resistors $R_1$ and $R_2$ and amplifier $A_1$ are not normally an integral part of the digital-to-analog converter, and a suitable reference voltage can be applied directly to the node $MSB_{REF}$ if desired.

Assume for purposes of explanation that the digital signal to be converted to an analog signal is N bits wide. The analog conversion of the M Most Significant Bits of the digital input signal is derived from the voltages on the nodes between adjacent resistors in a primary resistor string of series connected resistors $R_0$ through $R_{M-1}$. For the M bit primary segment, there will be $2^M$ identical resistors in the primary chain, and the multiplexer (decoder) will be a $2^M$ to 1 configuration. The voltage of the desired node between resistors is selected by applying the M Most Significant Bits of the digital input signal to the multiplexer, the output of which determines which one of the switches, typically MOS switches, each coupled to a respective resistor node, is on.

The voltage output $MSB_{out}$ from the multiplexer is fed into the non-inverting terminal of operational amplifier A2. The output of the amplifier is fed back to the inverting input through resistor $R_{GAIN}$, with the inverting input also coupled to the circuit ground through the series combination of resistors $R_{FLOW}$ and $R_{FHIGH}$. Thus the amplifier is configured as a non-inverting amplifier with a gain G2 given by:

$$G2 = 1 + \left(\frac{R_{GAIN}}{R_{FLOW} + R_{FHIGH}}\right)$$

Amplifier A2 can also function as the output driver for the digital-to-analog converter, or can be followed by further driver circuitry. Typically the gain G2 of the amplifier A2 is around 2, although this is not mandatory. Also, typically G1×G2=1 although this again is not a mandatory requirement.

As can be seen from the equation defining G2, the gain of this stage is controlled by the combined resistance of resistors $R_{FLOW}+R_{FHIGH}$ in relation to the single resistor $R_{GAIN}$. Fine control of the output voltage is achieved by introducing a current $I_{LSB}$ into the node between $R_{FLOW}$ and $R_{FHIGH}$. The magnitude of this current is controlled by the N–M Least Significant Bits (LSBs) of the digital input signal to be converted to analog form, where again, N is the overall resolution of the digital-to-analog converter (in number of bits) and M, as defined above, is the number of most significant bits used in the resistor chain segment of the converter. The current source for the current $I_{LSB}$ can have any one of $2^{(N-M)}$ values, the difference between each consecutive value being equal (for a linear converter), namely equal to one Least Significant Bit in the converter output. The effect of this current into the feedback network of amplifier A2 forms the secondary digital-to-analog converter segment. For instance, a 12 bit (N=12) converter may use the 8 most significant bits (M=8) in the primary segment and the 4 least significant bits in the secondary (12−8=4). Any split between primary and secondary segments is possible, typically dependent on the target silicon process and the overall desired performance and size of the digital-to-analog converter.

Including the effect of the injection of the current $I_{LSB}$ into the node between resistors $R_{FLOW}$ and $R_{FHIGH}$, the output of amplifier A2 is given by:

$$V_{OUT} = G2\left(V(MSB_{REF}) - \frac{I_{LSB}R_{FLOW}}{G_2}\right)$$

Note that with the feedback circuit for amplifier A2 shown in FIG. 1, the converter output voltage decreases for increasing values of $I_{LSB}$. In the case of G1×G2=1, if the current $I_{LSB}$ is controllable over $2^{(N-M)}$ discrete values of currents ranging from $I_{LSBUNIT}$ to $(N-M)I_{LSBUNIT}$, where the various parameters are selected so that $$\frac{I_{LSBUNIT}R_{FLOW}}{G2} = \frac{V_{REF}}{2^N},$$

then the output of the converter will go from 0 (or the negative reference if not 0) to $V_{REF}-1$ LSB, where the voltage increment representing the LSB is given by:

$$1LSB = \frac{V_{REF}}{2^N}$$

Figure 2:
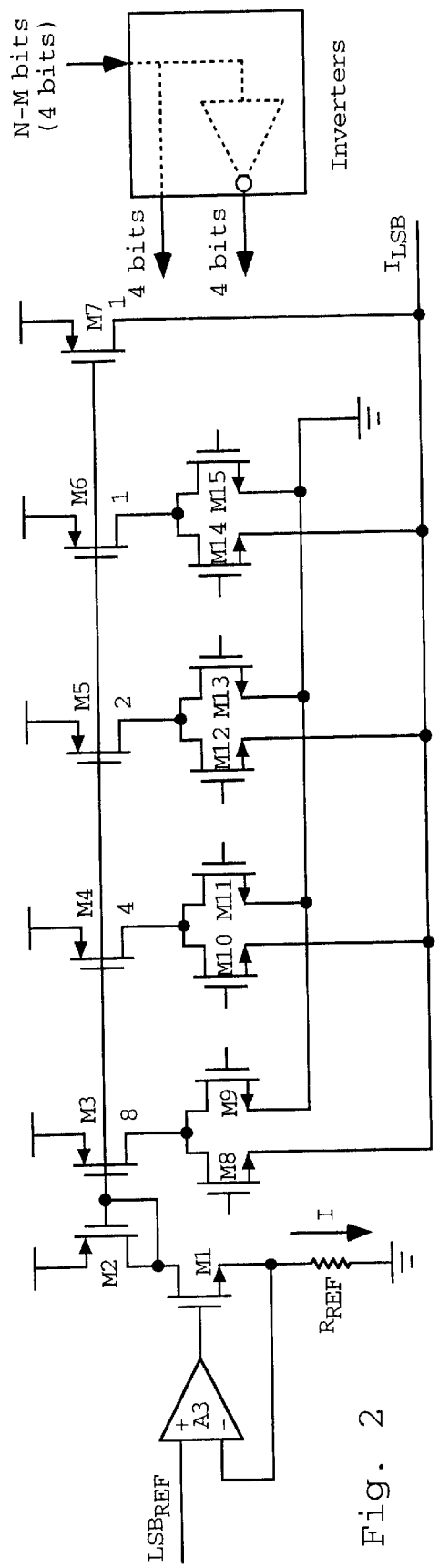
FIG. 2 is a circuit diagram for an exemplary controllable current source for generating the least significant bit current source $I_{LSB}$ used in the embodiment of FIG. 1.

An exemplary method of generating the current $I_{LSB}$ may be seen in FIG. 2, illustrating an exemplary embodiment for N−M=4. In this circuit, amplifier A3, transistor M1 and resistor $R_{REF}$ form a voltage to current (V to I) converter, as follows:

$$I=V_{LSBref}/R_{ref}$$

where:

I is the current through transistor M1

$V_{LSBref}$ is the reference voltage applied to the non-inverting input to amplifier A3

$R_{ref}$ is the resistance of the resistor coupled between the source of transistor M1 and the circuit ground.

Transistors M2 through M7 form a binary weighted current mirror, in this case a 4 bit weighting of relative currents of 8, 4, 2 and 1. Transistors M8 and M9 are used to steer the current from transistor M3 to ground (transistor M9 ON) or to the output $I_{LSB}$ (transistor M8 ON), i.e., into the top of $R_{FLOW}$ in FIG. 1, responsive to the state of a respective one of the four least significant control bits (LSBs), driving transistor M8 and its inverse driving transistor M9. Transistors M10 to M15 perform the same function for transistors M4 to M6 as transistors M8 and M9 perform for transistor M3. Transistor M7 (relative current of 1) is permanently connected to the output, which provides a minimum current equivalent to one Least Significant Bit in the converter output. This allows the output of the digital-to-analog converter to go down to zero, and up to within 1LSB of G1×G2×$V_{REF}$ (referring to FIG. 1). The steering of currents to the output $I_{LSB}$ or to ground in this manner minimizes disturbances by operating the current source at a constant current, as sum of the currents steered to the output $I_{LSB}$ plus the sum of the currents steered to ground is independent of the digital control signal.

Using the LSB generation scheme of FIG. 2 (shown here for 4 bits), the design of the MSB resistor string can be carried out completely independently to the LSB section. The only requirement is that:

$$R_{REF} = \frac{\left(\frac{V(LSB_{REF})}{V(MSB_{REF})}\right)*M*R_{FLOW}}{G2}$$

where:

M is (as defined previously) the number of elements in the primary string $R_{FLOW}$ is as shown in FIG. 1

$V(LSB_{REF})$ is the reference voltage to the LSB section (see FIG. 2)

$V(MSB_{REF})$ is the reference voltage to the MSB section (see FIG. 1).

Note that the ratio of $R_{FLOW}$ to $R_{FHIGH}$ is not important, and can be selected as a design parameter. This allows a lot of flexibility as $R_{FLOW}$ and $R_{FHIGH}$ need not match at all. This allows the possibility of, for instance, using a different type of resistor for the majority of the feedback resistance. Note that $R_{GAIN}$ must still match the composite of $R_{FLOW}+R_{FHIGH}$, so must be made of the same elements. As an example, $R_{FLOW}$ may be a 5 kΩ thin film resistor, and $R_{FHIGH}$ may be a 95 kΩ N-well resistor. For a gain of G2=3, the resistor $R_{GAIN}$ should be made up from a 10k thin film resistor and 190 kΩ N-well resistor.

The LSB current ILSB generation need not utilize a binary weighted scheme as described above. Indeed, a thermometer code approach, such as that shown in FIG. 3, offers significant performance advantages in that monotonicity is guaranteed throughout the least significant bit section. Here, fifteen switches SW1 through SW15 (typically MOS switches) each direct an increment of current (all having a relative weight of 1) though mirrored transistors M3 through M17, respectively, to the output $I_{LSB}$ or to the circuit ground. The switches SW1 through SW15 are controlled through a four bit least significant bit decoder (in the exemplary embodiment) so that all switches above a decoded value are off, and all other switches are on. Consequently an increment in the decoded value always adds an increment in current to the current $I_{LSB}$. As before, one fixed increment of current is provided by transistor M18 to allow the converter to range from 0 to one Least Significant Bit below G1×G2×$V_{REF}$ (referring to FIG. 1).

Figure 3:
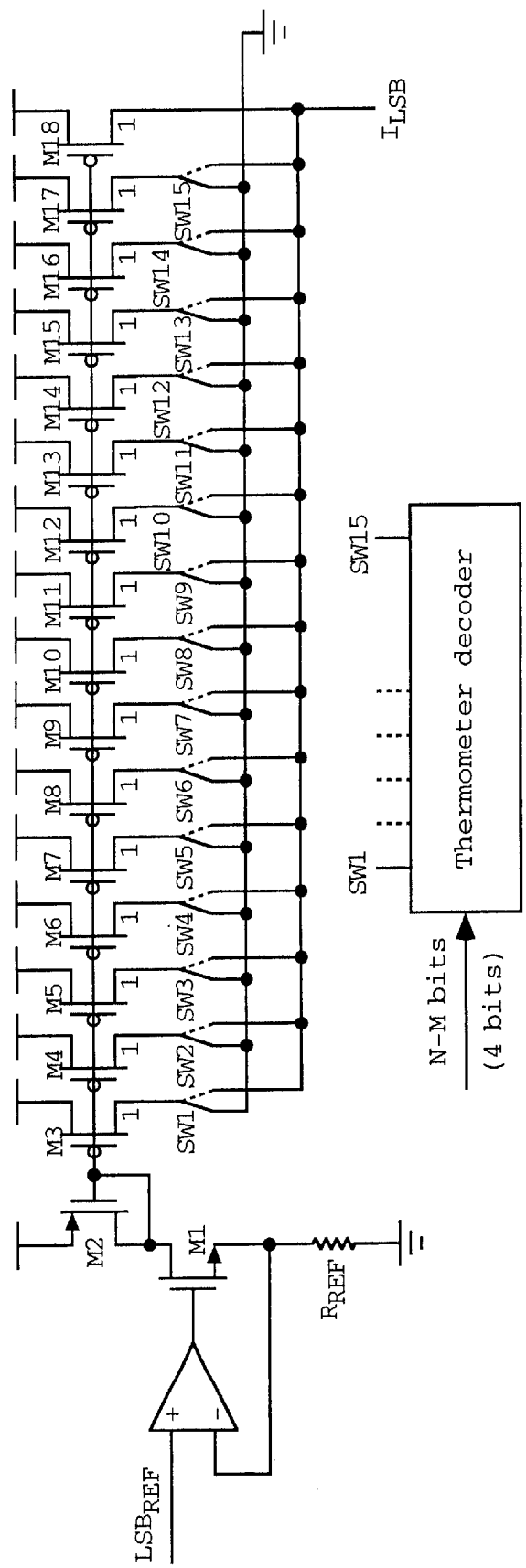
FIG. 3 is a circuit diagram for an alternate exemplary controllable current source for generating the least significant bit current source $I_{LSB}$ used in the embodiment of FIG. 1.

Note that in the event the reference voltage $V_{REF}$ of FIG. 1 is a constant voltage, the voltage $LSB_{REF}$ of FIG. 2 or of FIG. 3, by way of example, will also be a fixed voltage, and may be derived from a common voltage source. In the case of ratiometric devices, the reference voltage $V_{REF}$ and the voltage $LSB_{REF}$ will both vary together, and again may be derived from a common source, typically a common input such as the circuit power supply voltage itself or a separate analog input to be converted to an analog output with a digitally controlled gain.

Since monotonicity is also guaranteed in the MSB section (an inherent feature of any series resistor string digital-toanalog converter stage), to guarantee an overall monotonic digital-to-analog converter, all that is required is that the LSB section overall is skewed less than 1 LSB with respect to the MSB string. Thus a single point trim (on the LSB section reference current) may be used to adjust the MSB to LSB skew and hence guarantee monotonicity if native accuracy is not sufficient.

It should be recognized that other schemes to generate the current $I_{LSB}$, including (but not limited to) the use of the MSB resistor string as $R_{REF}$ and the use of other decodes besides binary weighted and thermometer do not depart from the spirit of this invention. Also, while operational amplifier A2 and its feedback circuitry convert the $I_{LSB}$ current to a voltage to provided a digital-to-analog converter voltage output, a corresponding circuit could be used to instead convert the voltage output of the resistor string digital-to-analog converter to a current and to combine the same with the current $I_{LSB}$ to provide an digital-to-analog converter with a current output.

There has been described herein a segmented digital-to-analog converter architecture intended primarily for integration on a microchip. The resistor string primary and current-mode secondary provides the advantages of flexibility during design of size and performance, no difficult or code-dependent loading demands are placed on the string elements or switches, no inherent mutual interaction between primary and secondary stages, and simple matching requirements ensure that low Differential Non Linearity (DNL) is relatively easy to achieve. While certain preferred embodiments of the present invention have been disclosed and described herein, it will be understood by those skilled in the art that various changes in form and detail may be made therein without departing from the spirit and scope of the invention.

What is claimed is:

1. A segmented resistor string digital-to-analog converter for converting an N bit digital signal to analog form comprising:

an M bit resistor string digital-to-analog converter converting the M most significant bits of the digital signal to analog form, where M is less than N;

a controllable current source providing a current source output controllable in current increments responsive to the N–M least significant bits of the digital signal;

a circuit coupled to the output of the M bit resistor string digital-to-analog converter and to the controllable current source output providing an output responsive to the combination of the voltage output of the M bit resistor string digital-to-analog converter and the controllable current source output.

2. The segmented resistor string digital-to-analog converter of claim 1 wherein the circuit coupled to the output of the M bit resistor string digital-to-analog converter and to the controllable current source output provides a voltage output responsive to the voltage output of the M bit resistor string digital-to-analog converter minus least significant bit voltage increments responsive to the controllable current source output.

3. The segmented resistor string digital-to-analog converter of claim 2 wherein the controllable current source is controllable in least significant bit increments ranging upward from a minimum of one least significant bit current.

4. The segmented resistor string digital-to-analog converter of claim 2 wherein the circuit coupled to the output of the M bit resistor string digital-to-analog converter and to the controllable current source output comprises an operational amplifier with a feedback circuit coupled to the inverting amplifier input, the output of the M bit resistor string digital-to-analog converter being coupled to the non-inverting amplifier input and the controllable current source output being coupled to the feedback circuit.

5. The segmented resistor string digital-to-analog converter of claim 1 wherein the controllable current source is binary weighted current steering current source.

6. The segmented resistor string digital-to-analog converter of claim 1 wherein the controllable current source is a thermometer code current source.

7. A method of digital-to-analog conversion for converting an N bit digital signal to an analog output comprising:

converting the M most significant bits of the digital signal to an analog voltage, where M is less than N, using an M bit resistor string digital-to-analog converter;

converting the N–M least significant bits in the digital signal to a current responsive in current increments to the decoded N–M least significant bits;

providing the analog output by combining the analog voltage of the M bit resistor string digital-to-analog converter and the current responsive to the decoded N–M least significant bits.

8. The method of digital-to-analog conversion of claim 7 wherein the analog output is an analog voltage output responsive to the an analog voltage of the resistor string digital-to-analog convert e r minus the current responsive to the decoded N–M least significant bits.

9. The method of digital-to-analog conversion of claim 8 wherein the N–M least significant bits in the digital signal is converted to a current in least significant bit increments having a minimum current of one least significant bit current.

10. The segmented resistor string digital-to-analog converter of claim 8 wherein the analog output is provided by combining the analog voltage of the resistor string digital-to-analog converter and the current responsive to the decoded least significant bits using an operational amplifier.

11. The method of digital-to-analog conversion of claim 7 wherein the N–M least significant bits in the digital signal are converted to a current using a binary weighted current steering current source.

12. The method of digital-to-analog conversion of claim 7 wherein the N–M least significant bits in the digital signal are converted to a current using a thermometer code current source.

* * * * *